(12) United States Patent
Kim et al.

(10) Patent No.: US 12,198,893 B2
(45) Date of Patent: Jan. 14, 2025

(54) PLASMA PROCESS MONITORING APPARATUS USING TERAHERTZ WAVES AND MONITORING METHOD THEREOF

(71) Applicant: IUCF-HYU (INDUSTRY-UNIVERSITY COOPERATION FOUNDATION HANYANG UNIVERSITY), Seoul (KR)

(72) Inventors: Hak Sung Kim, Seoul (KR); Dong Woon Park, Seoul (KR); Heon Su Kim, Seoul (KR); Sang Ii Kim, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 0 days.

(21) Appl. No.: 18/647,096

(22) Filed: Apr. 26, 2024

(65) Prior Publication Data

US 2024/0297014 A1    Sep. 5, 2024

Related U.S. Application Data

(63) Continuation of application No. PCT/KR2022/016322, filed on Oct. 25, 2022.

(30) Foreign Application Priority Data

Oct. 29, 2021  (KR) .................. 10-2021-0146359
Dec. 17, 2021  (KR) .................. 10-2021-0181471

(51) Int. Cl.
*H01J 37/244*    (2006.01)
*H01J 37/32*     (2006.01)

(52) U.S. Cl.
CPC ...... *H01J 37/244* (2013.01); *H01J 37/32458* (2013.01); *H01J 37/32917* (2013.01);
(Continued)

(58) Field of Classification Search
CPC ............ H01J 37/244; H01J 37/32458; H01J 37/32917; H01J 2237/24507; H01J 2237/24578; H01J 37/32; G01N 21/3581
See application file for complete search history.

(56) References Cited

U.S. PATENT DOCUMENTS 8,088,247 B2 *  1/2012  Usui ................ H01J 37/32935
                                                        118/712
2008/0216956 A1 *  9/2008  Nakamoto ......... G01B 11/0625
                                                        156/345.25
2008/0278721 A1   11/2008  Bai et al.

FOREIGN PATENT DOCUMENTS

JP      5992147 B2     9/2016
JP    2019-060829 A    4/2019
(Continued)

OTHER PUBLICATIONS

International Search Report for PCT/KR2022/016322, dated Feb. 9, 2023.

*Primary Examiner* — Seung C Sohn
(74) *Attorney, Agent, or Firm* — Sughrue Mion, PLLC

(57) ABSTRACT

A plasma process monitoring apparatus using terahertz waves is provided. A plasma process monitoring apparatus using terahertz waves may comprise: a first monitoring module disposed in a direction parallel to the width direction of a wafer on the outside of a plasma chamber in which the wafer is introduced and monitoring plasma formed inside the plasma chamber during a plasma process for forming a film on the wafer by using terahertz waves; and a second monitoring module disposed outside the plasma chamber in the thickness direction of the wafer so as to face the wafer (Continued)

and monitoring the wafer on which a film is formed on a surface through the plasma process by using the terahertz waves.

14 Claims, 25 Drawing Sheets

(52) U.S. Cl.
CPC ............... *H01J 2237/24507* (2013.01); *H01J 2237/24578* (2013.01)

(56) References Cited

FOREIGN PATENT DOCUMENTS

| | | |
|---|---|---|
| KR | 10-1553149 B1 | 9/2015 |
| KR | 10-1600520 B1 | 3/2016 |
| KR | 10-1739628 A | 5/2017 |
| KR | 10-2020-0070509 A | 6/2020 |
| KR | 10-2141228 B1 | 8/2020 |
| WO | 2019/046689 A1 | 3/2019 |

* cited by examiner

[FIG. 1]
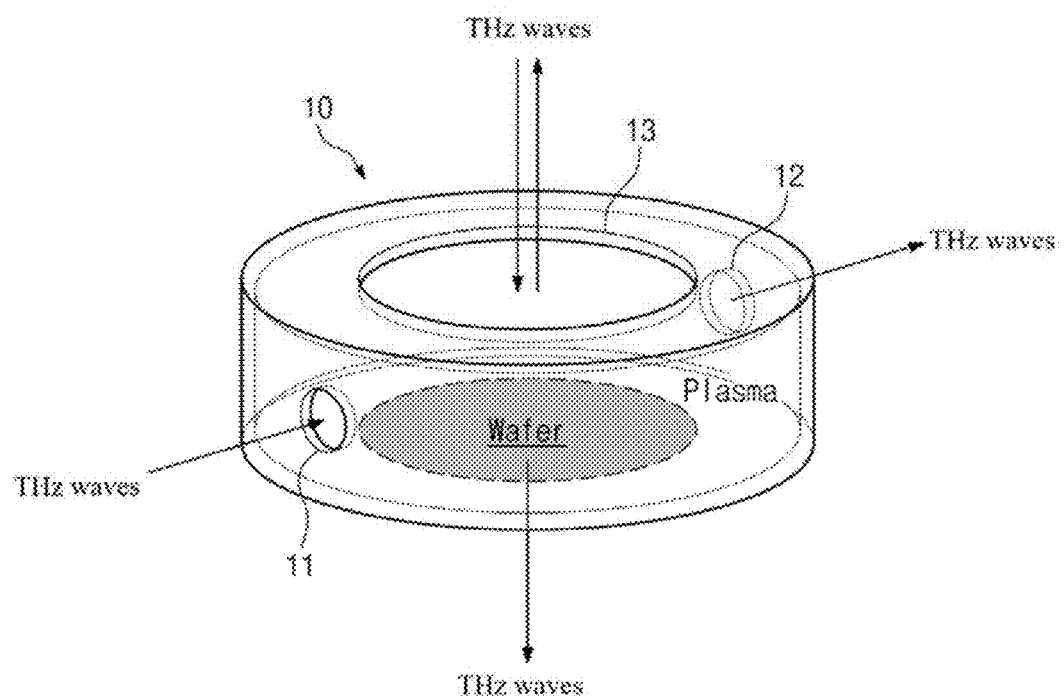

[FIG. 2]
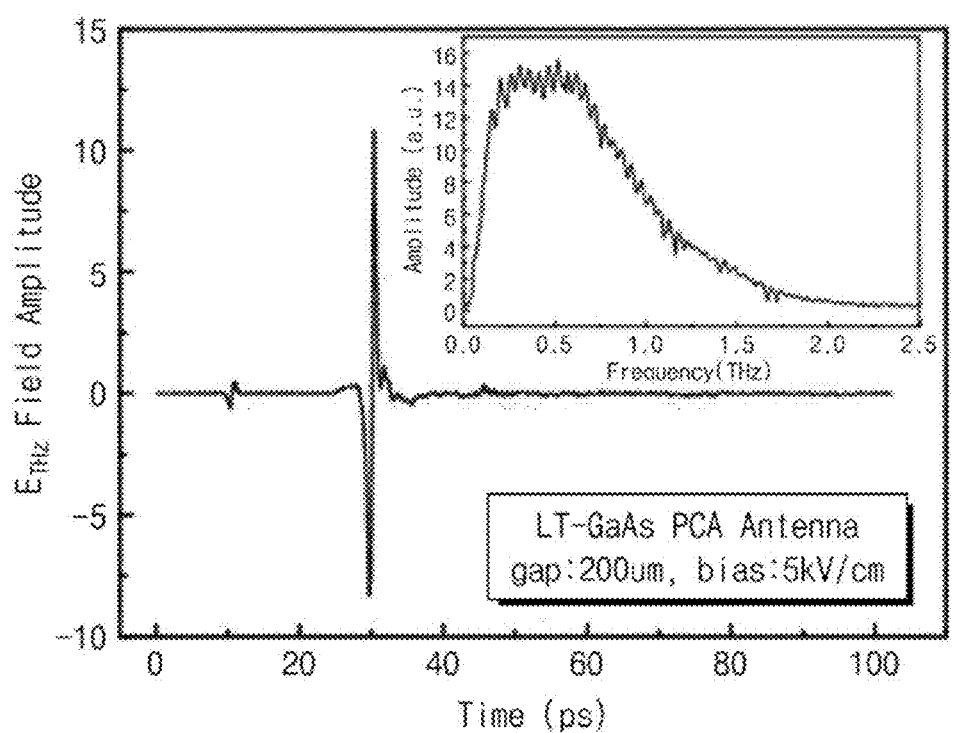

[FIG. 3]
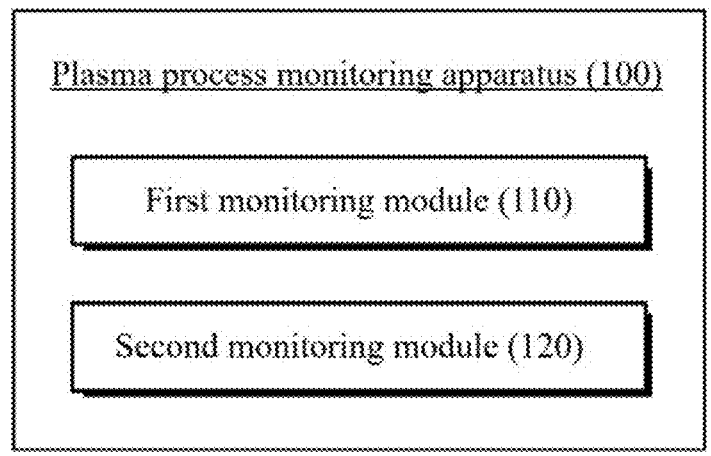

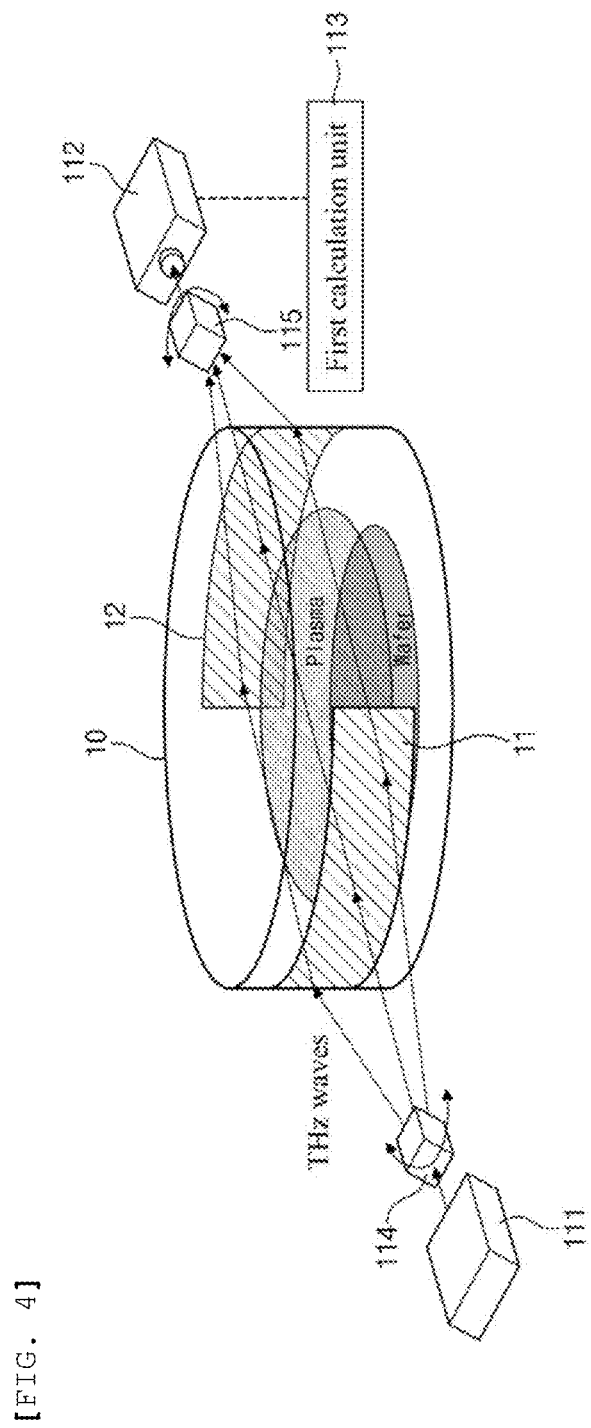
[FIG. 4]

[FIG. 5]
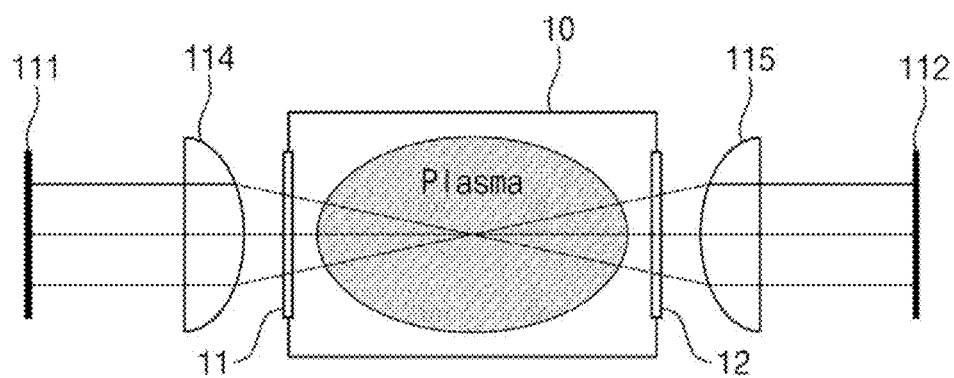

[FIG. 6]
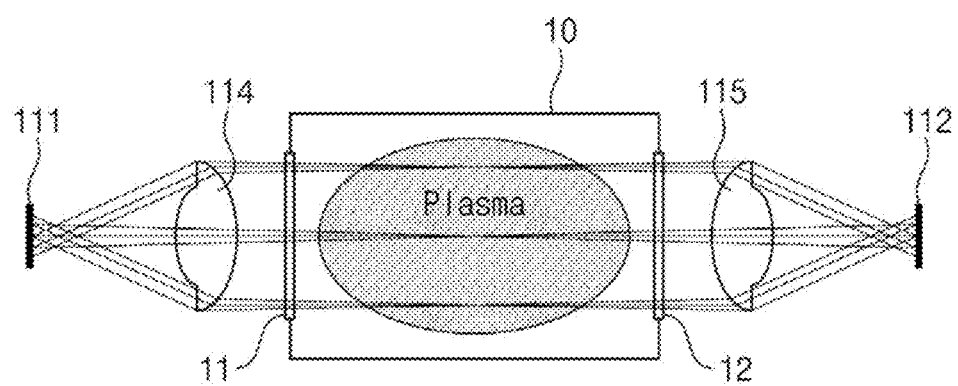

[FIG. 7]
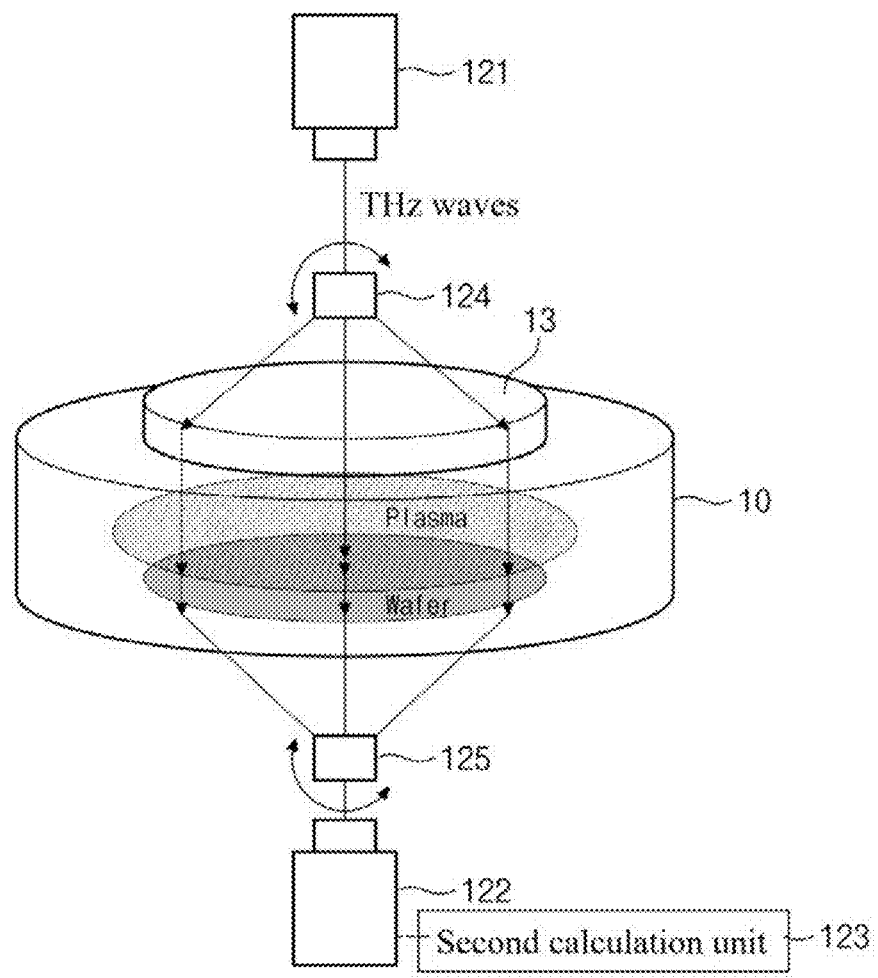

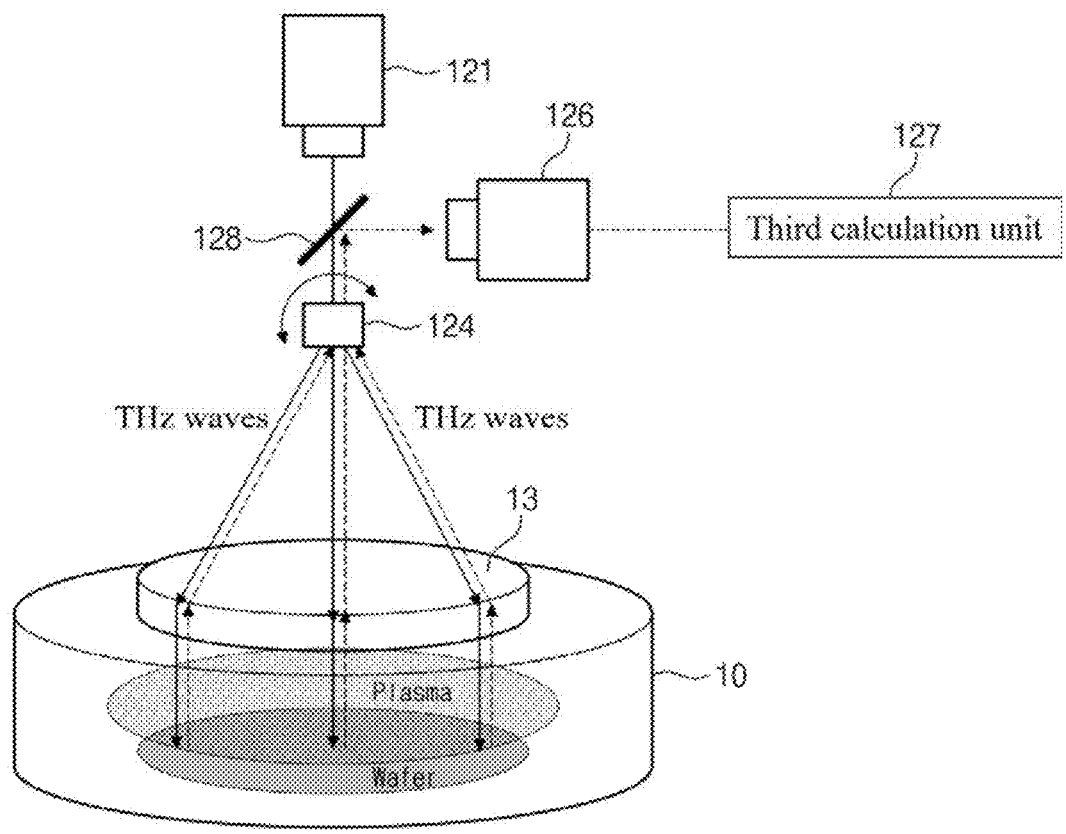
【FIG. 8】

[FIG. 9]
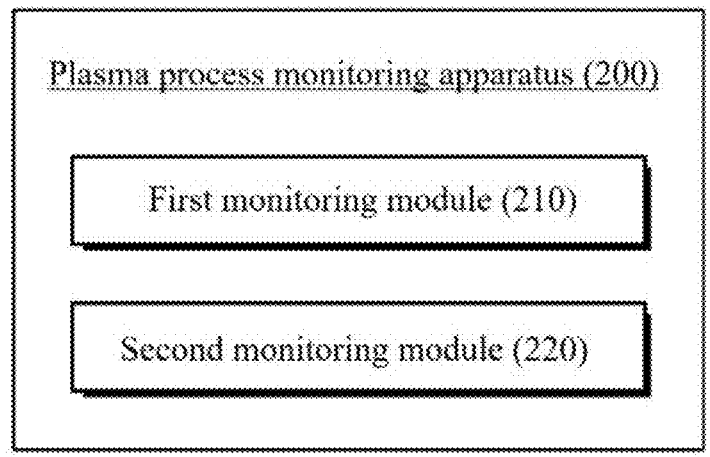

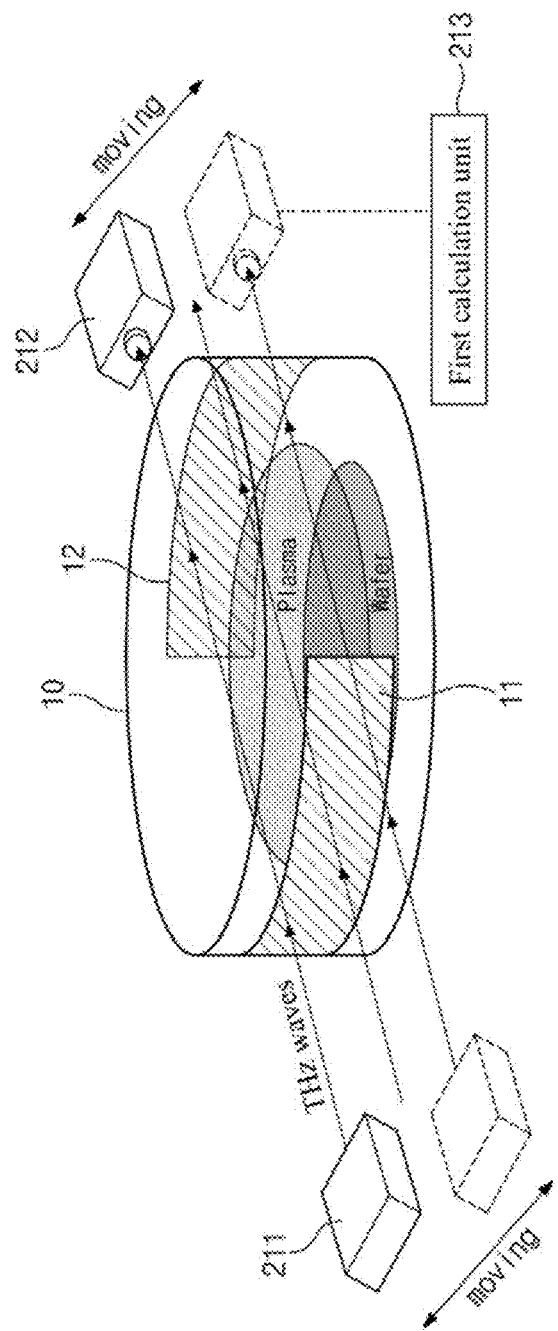
[FIG. 10]

[FIG. 11]
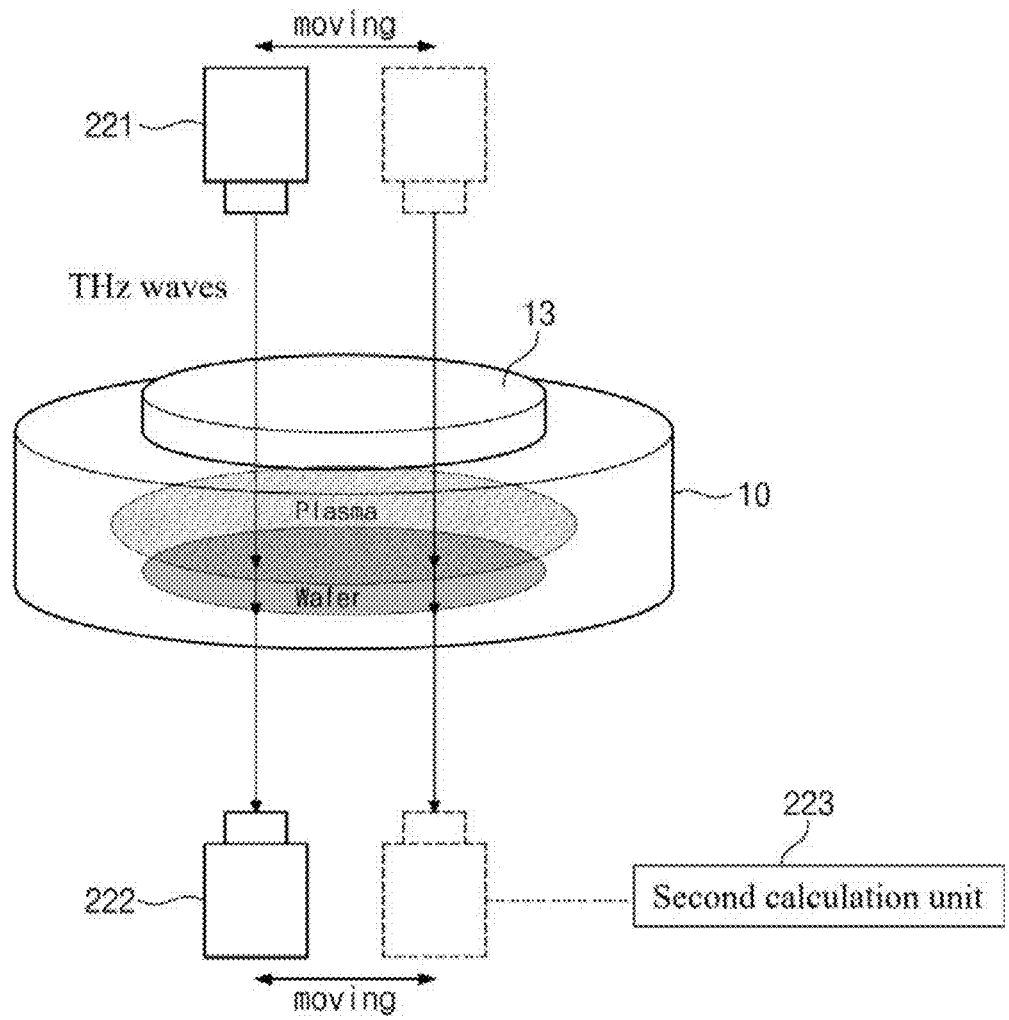

[FIG. 12]
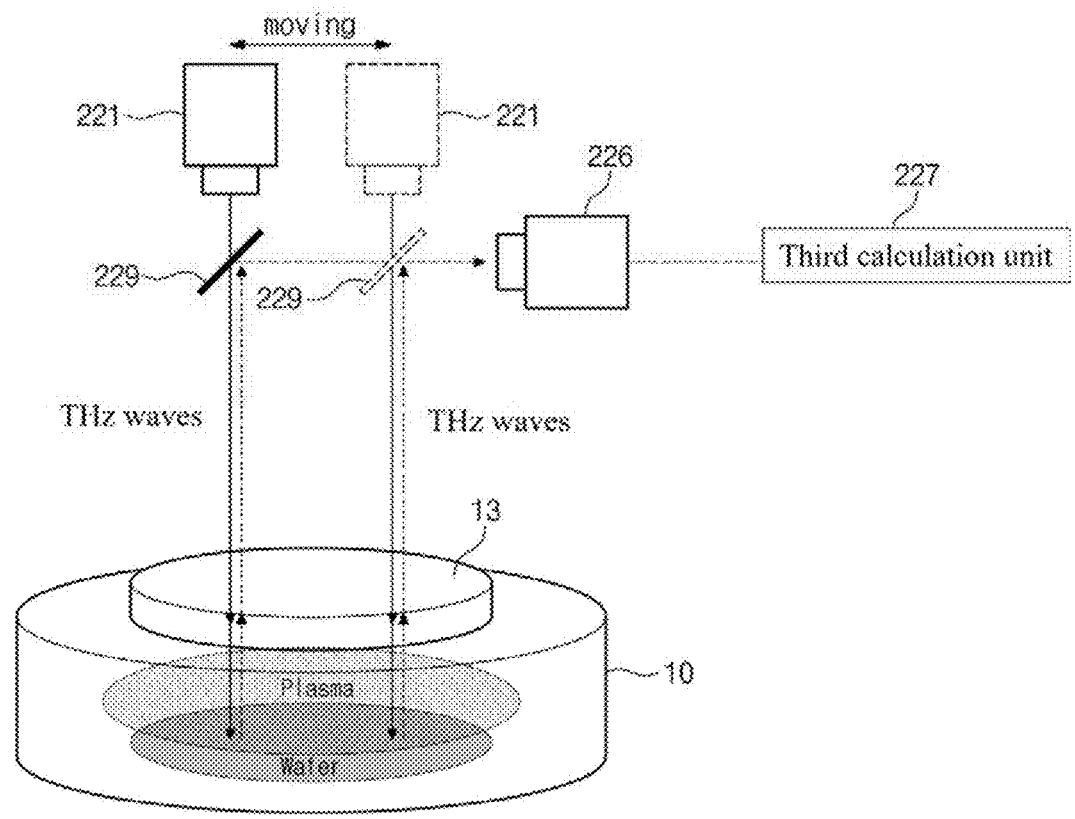

[FIG. 13]
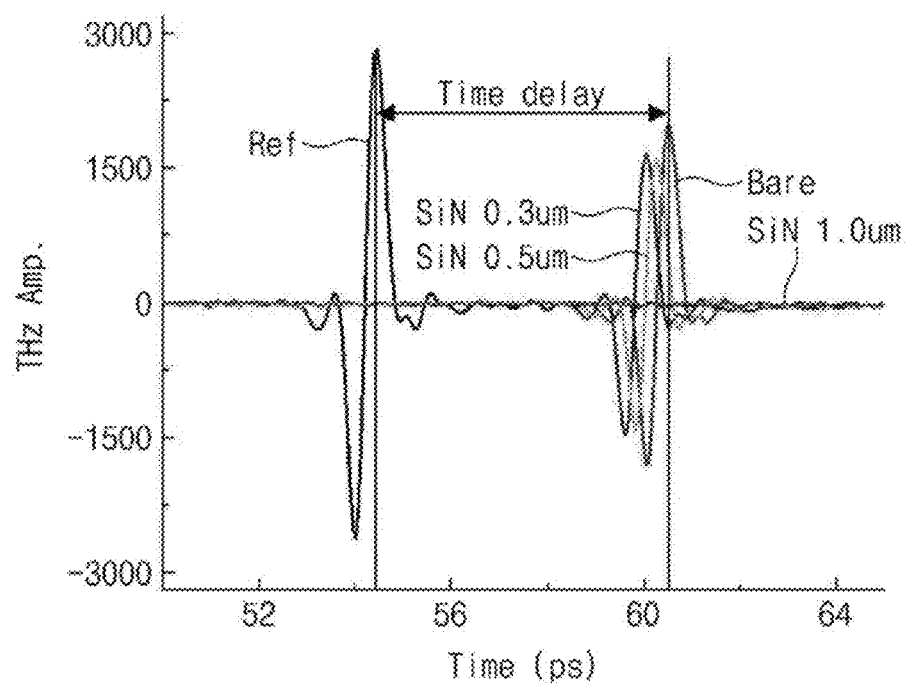

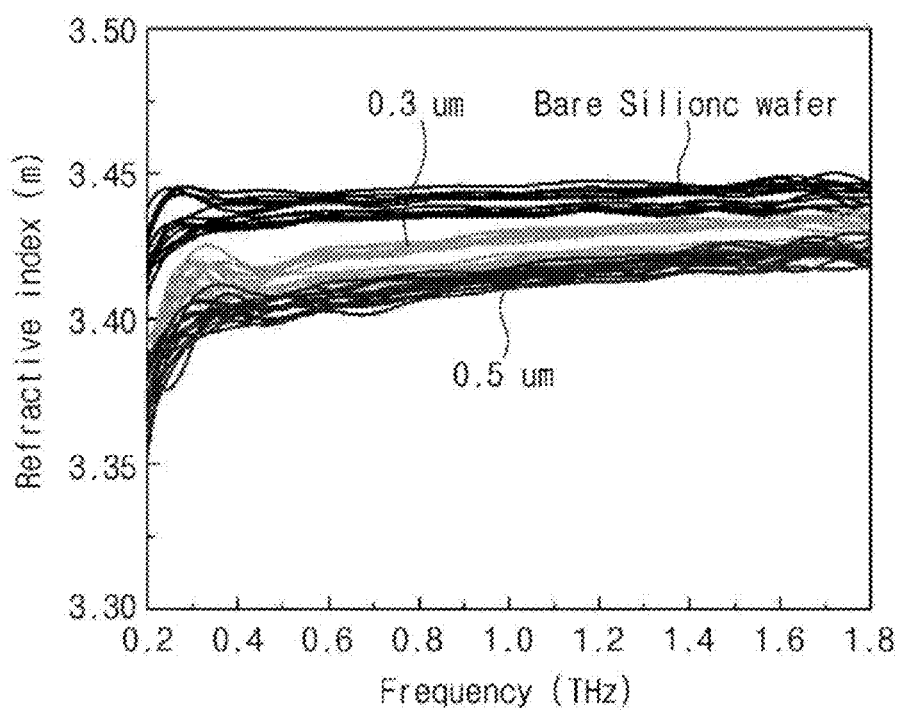
[FIG. 14]

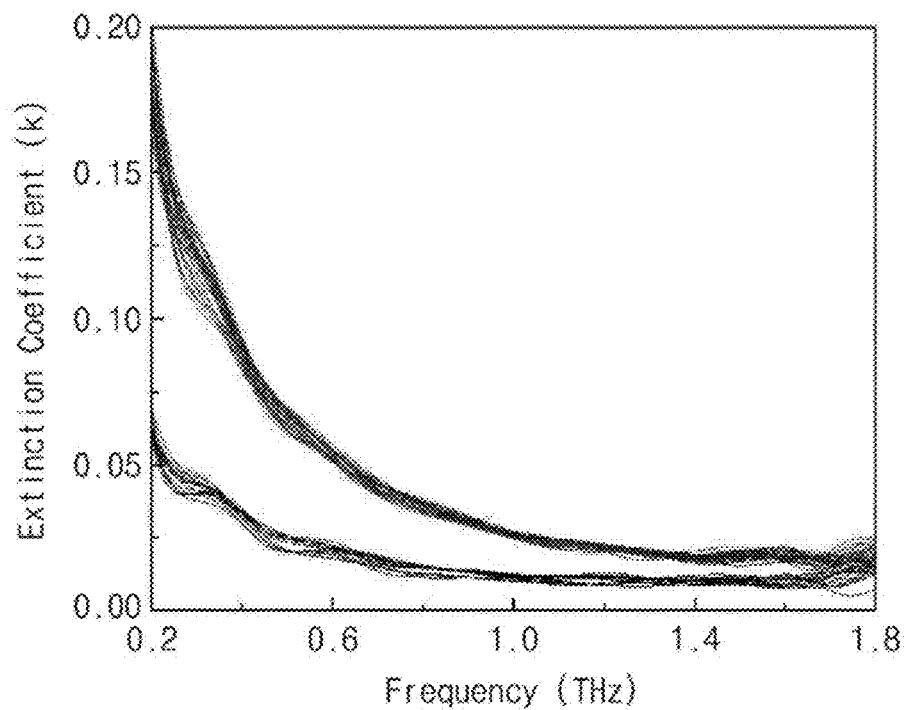
[FIG. 15]

【FIG. 16】
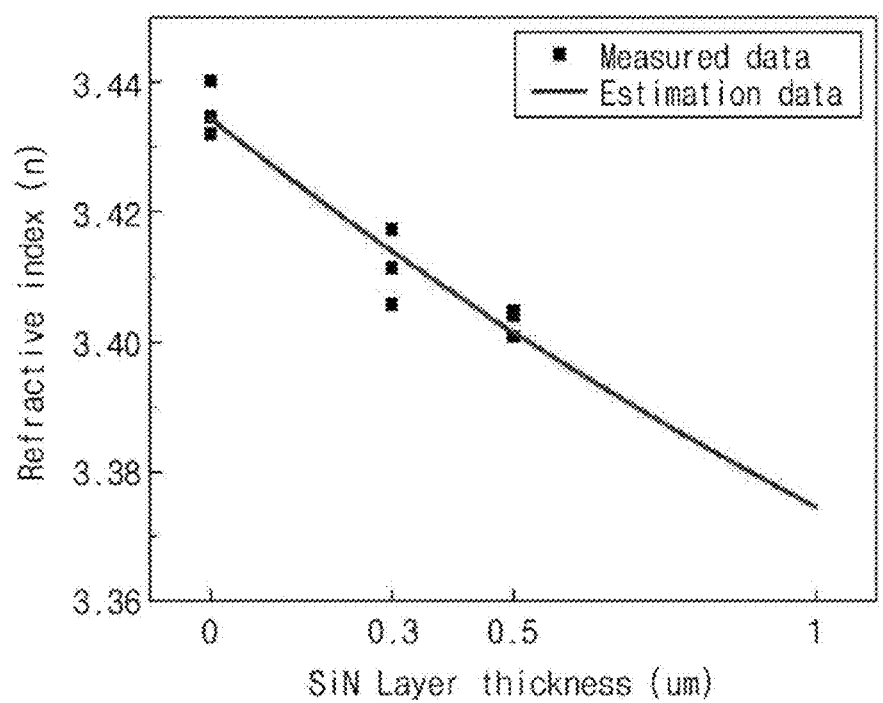

[FIG. 17]
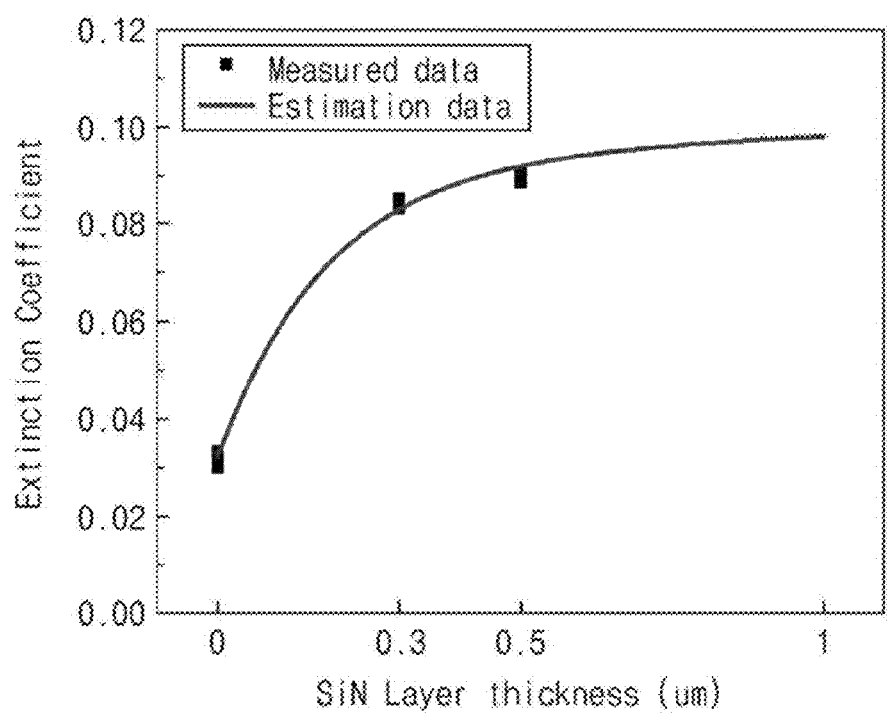

[FIG. 18]
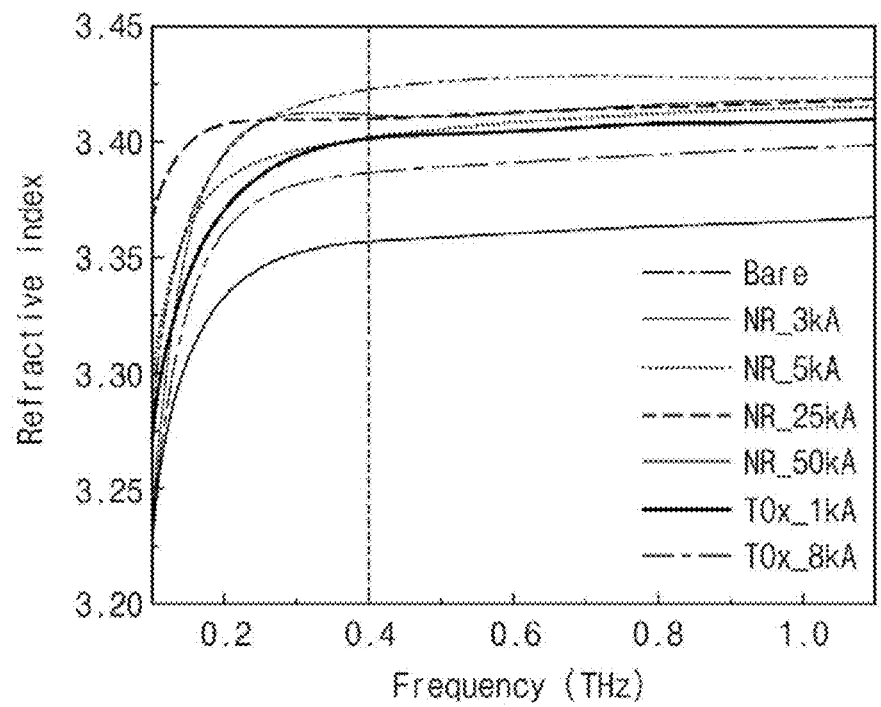

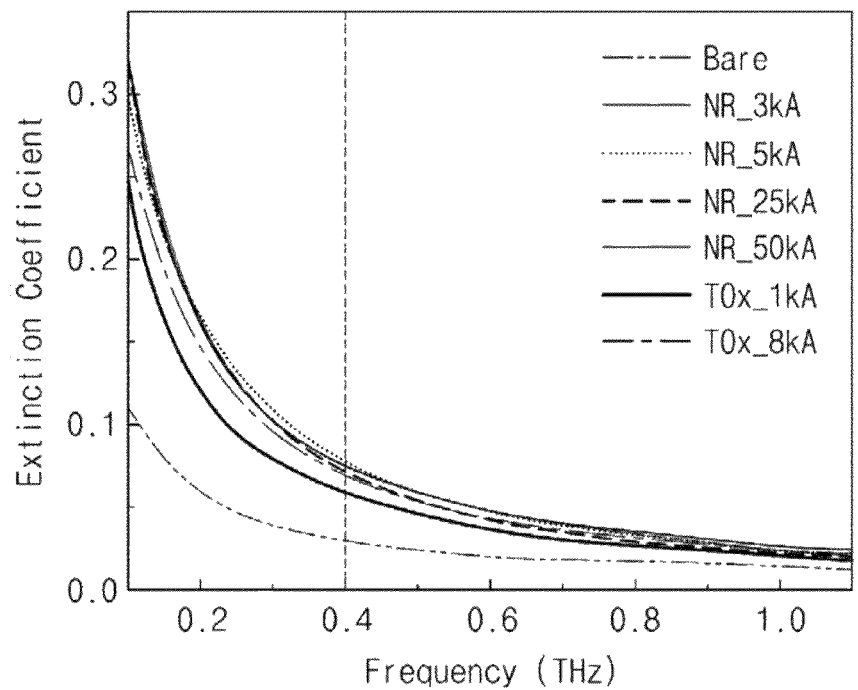
[FIG. 19]

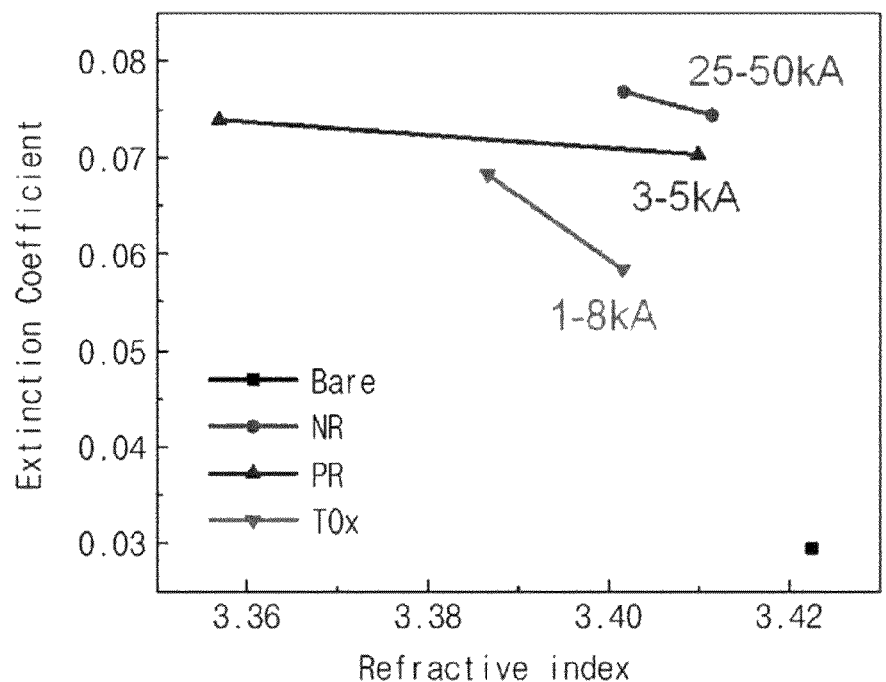
[FIG. 20]

[FIG. 21]
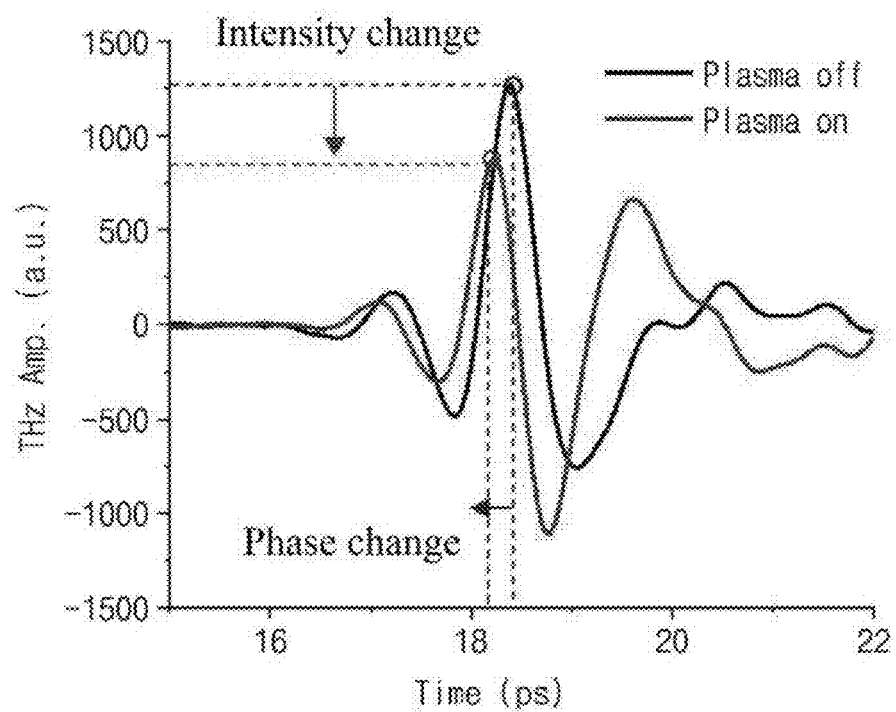

[FIG. 22]
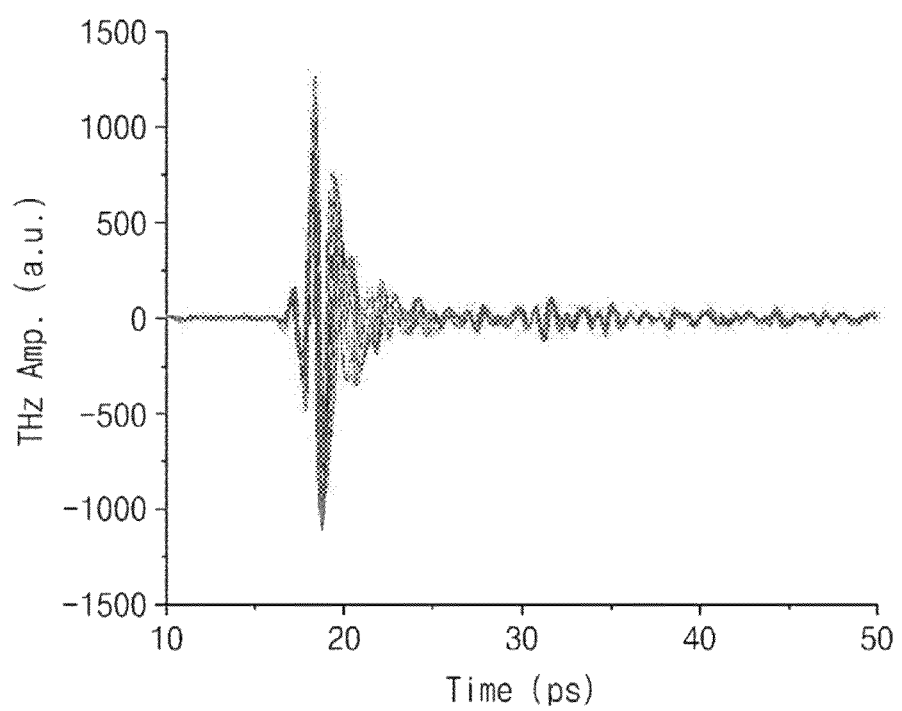

[FIG. 23]
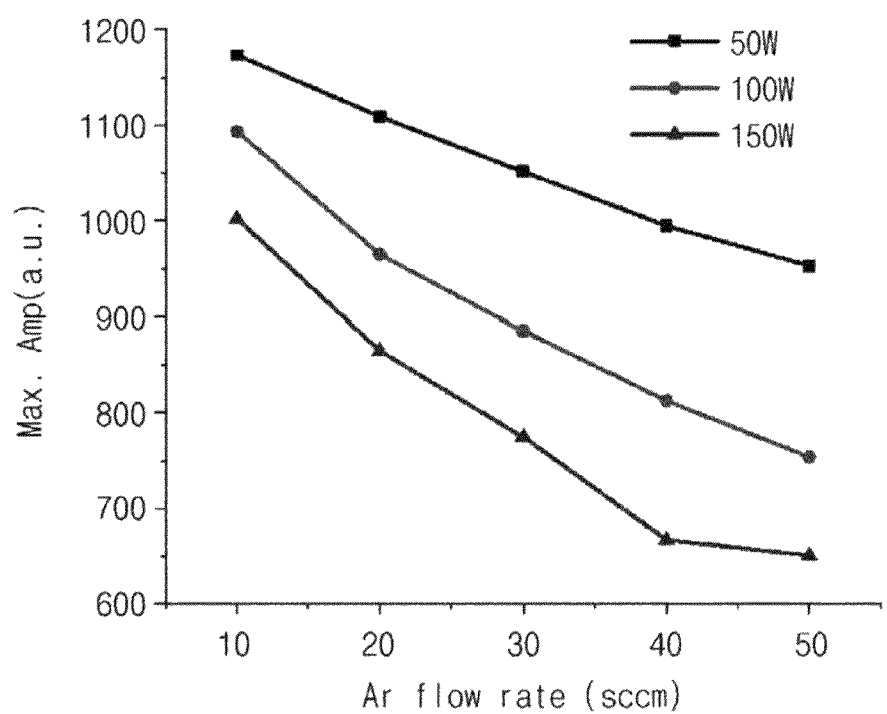

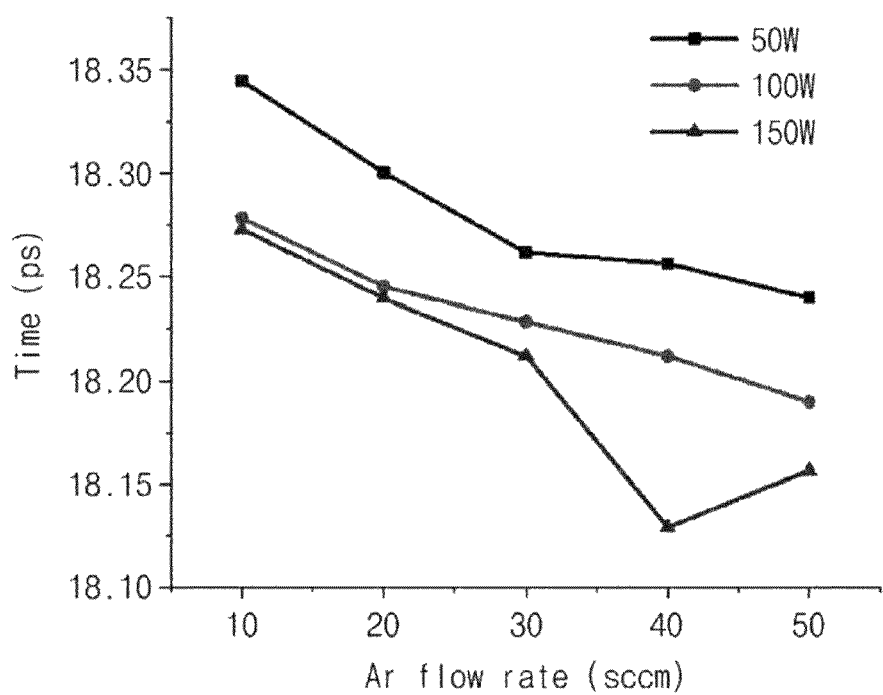
[FIG. 24]

[FIG. 25]
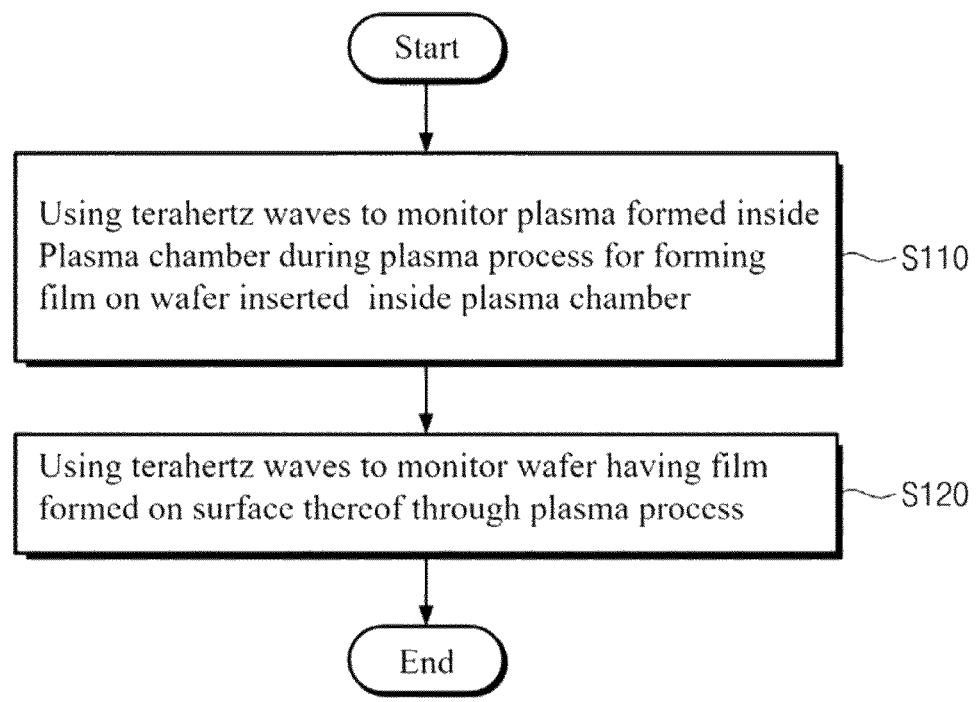

PLASMA PROCESS MONITORING APPARATUS USING TERAHERTZ WAVES AND MONITORING METHOD THEREOF

CROSS REFERENCE TO RELATED APPLICATIONS

This application is a Rule 53 (b) Continuation of International Application No. PCT/KR2022/016322 filed on Oct. 25, 2022, claiming priority based on Korean Patent Application No. 10-2021-0146359 filed on Oct. 29, 2021 and Korean patent Application No. 10-2021-0181471 filed on Dec. 17, 2021, the respective disclosures of all of the above of which are incorporated herein by reference in their entirety.

TECHNICAL FIELD

The present invention relates to a plasma process monitoring apparatus using terahertz waves and a monitoring method thereof, and more specifically, to a plasma process monitoring apparatus using terahertz waves and a monitoring method thereof, in which the terahertz waves to simultaneously monitor are used a state of plasma formed inside a plasma chamber into which a wafer is inserted during a plasma process, and a status of the wafer having a film formed on a surface thereof through the plasma process.

BACKGROUND ART

In general, when manufacturing semiconductors, solar cells, secondary battery membranes, and the like, a process of forming a thin film layer made of various materials on a wafer is essentially used. For example, the process for forming the thin film layer includes a plasma deposition process and a plasma etching process.

In the related art, deposition and etching states of a thin film according to a plasma process are monitored, for example, during manufacturing of a semiconductor.

Understanding plasma characteristic information is directly linked to quality of a product, that is, a semiconductor, but it is difficult to monitor due to the characteristics of plasma. Accordingly, in the related art, it is not easy to identify the cause when a problem occurs during the plasma process.

Thus, there is a need to develop an apparatus capable of monitoring the deposition and etching state of the thin film as well as the state of the plasma simultaneously or at the same time during the plasma process.

DISCLOSURE

Technical Problem

One technical problem to be solved by the present invention is to provide a plasma process monitoring apparatus using terahertz waves and a monitoring method thereof in which the terahertz waves are used to simultaneously monitor a state of plasma formed inside a plasma chamber into which a wafer is inserted during a plasma process, and a status of the wafer having a film formed on a surface thereof through the plasma process.

Another technical problem to be solved by the present invention is to provide a plasma process monitoring apparatus using terahertz waves and a monitoring method thereof to confirm the uniformity of etching and deposition for a formed film and the uniformity of plasma used in etching and deposition processes, for each pixel of a wafer.

The technical problems to be solved by the present invention are not limited to the above description.

Technical Solution

In order to solve the above-mentioned technical problems, the present invention provides a plasma process monitoring apparatus using terahertz waves.

According to one embodiment, the plasma process monitoring apparatus using terahertz waves includes: a first monitoring module disposed in a direction parallel to the width direction of a wafer on the outside of a plasma chamber in which the wafer is introduced and monitoring plasma formed inside the plasma chamber during a plasma process for forming a film on the wafer by using terahertz waves; and a second monitoring module disposed outside the plasma chamber in the thickness direction of the wafer so as to face the wafer and monitoring the wafer on which a film is formed on a surface through the plasma process by using the terahertz waves.

According to one embodiment, the terahertz waves may be provided in a pulsed type.

According to one embodiment, the plasma chamber may be provided on one side and an opposite side thereof with a first transmission window and a second transmission window in a circumferential direction to face each other, and the first monitoring module may include: a first emitter facing the first transmission window to generate terahertz waves in a direction of the first transmission window; a first detector facing the second transmission window and aligned in one direction with the first emitter to detect the terahertz waves generated from the first emitter and passing through plasma formed inside the plasma chamber; and a first calculation unit for analyzing a state of the plasma based on a signal detected by the first detector.

According to one embodiment, the first monitoring module may further include a first optical system and a second optical system, in which the first optical system may be provided between the first emitter and the first transmission window, the second optical system may be provided between the second transmission window and the first detector, and the terahertz waves generated from the first emitter may be irradiated to the plasma through the first optical system and then guided to the first detector by the second optical system.

According to one embodiment, the first emitter may generate the terahertz waves while moving in a width direction of the first transmission window, and the first detector may detect the terahertz waves while moving in a width direction of the second transmission window in conjunction with movement of the first emitter.

According to one embodiment, the plasma chamber may be provided on an upper side thereof with a third transmission window, and the second monitoring module may monitor the wafer in a transmission mode, and include a second emitter facing the third transmission window to generate terahertz waves in a direction of the third transmission window; a second detector disposed below the wafer and aligned with the second emitter in a thickness direction of the wafer to detect the terahertz waves generated from the second emitter and passing through the wafer; and a second calculation unit for analyzing a state of the wafer based on a signal detected by the second detector.

According to one embodiment, the second monitoring module may further include a third optical system and a fourth optical system, in which the third optical system may be provided between the second emitter and the third transmission window, the fourth optical system may be provided between the wafer and the second detector, and the terahertz waves generated from the second emitter may be irradiated to the wafer through the third optical system, pass through the wafer, and then be guided to the second detector by the fourth optical system.

According to one embodiment, the second monitoring module may switch the transmission mode into a reflection mode to further monitor the wafer, and further include: a third detector disposed at one side of the second emitter to detect the terahertz waves generated from the second emitter, irradiated to the wafer, and then reflected from the wafer; and a third calculation unit for analyzing a state of the wafer based on a signal detected by the third detector.

According to one embodiment, the second monitoring module may further include a fifth optical system, in which the fifth optical system may be provided between the third optical system and the third detector, and the terahertz waves generated from the second emitter may be irradiated to the wafer through the third optical system, reflected from the wafer, focused by the third optical system, irradiated toward the fifth optical system, and then guided to the third detector by the fifth optical system.

According to one embodiment, the second emitter may generate the terahertz waves while moving in a width direction of the third transmission window, and the second detector may detect the terahertz waves passing through the wafer while moving in a width direction of the wafer in conjunction with movement of the second emitter.

According to one embodiment, the second monitoring module may switch the transmission mode into a reflection mode to monitor the wafer, and further include: a third detector disposed at one side of the second emitter to detect the terahertz waves generated from the second emitter, irradiated to the wafer, and then reflected from the wafer; a third calculation unit for analyzing a state of the wafer based on a signal detected by the third detector; and a sixth optical system provided between the wafer and the third detector, wherein the second emitter may generate the terahertz waves while moving in a width direction of the third transmission window, and the sixth optical system may guide the terahertz waves reflected from the wafer to the third detector in conjunction with the movement of the second emitter.

According to one embodiment, the plasma chamber may be provided on one side and an opposite side thereof with a first transmission window and a second transmission window in a circumferential direction to face each other and provided on an upper side thereof with a third transmission window, in which the first transmission window to third transmission window may be formed of any one selected from the candidate material group including Si, HRFZ-SI, PTFE, PTFE, TPX, and quartz (SiO2) to transmit the terahertz waves.

Meanwhile, the present invention provides a plasma process monitoring method using terahertz waves.

According to one embodiment, the plasma process monitoring method using terahertz waves includes: using the terahertz waves to monitor plasma formed inside a plasma chamber during a plasma process for forming a film on a wafer inserted inside the plasma chamber; and using the terahertz waves to monitor wafer having film formed on surface thereof through plasma process, wherein the monitoring of the plasma and the monitoring of the wafer may be performed simultaneously, and the terahertz waves may be provided in a pulsed type.

According to one embodiment, the monitoring of the plasma may include analyzing a state of the plasma based on a signal detected by terahertz waves passing through the plasma formed inside the plasma chamber, and the monitoring of the wafer may include analyzing a state of the wafer based on a signal obtained by detecting terahertz waves passing through the wafer or analyzing a state of the wafer based on a signal obtained by detecting terahertz waves reflected from the wafer.

Advantageous Effects

The embodiment of the present invention includes: a first monitoring module disposed in a direction parallel to the width direction of a wafer on the outside of a plasma chamber in which the wafer is introduced and monitoring plasma formed inside the plasma chamber during a plasma process for forming a film on the wafer by using terahertz waves; and a second monitoring module disposed outside the plasma chamber in the thickness direction of the wafer so as to face the wafer and monitoring the wafer on which a film is formed on a surface through the plasma process by using the terahertz waves.

Accordingly, the plasma process monitoring apparatus using the terahertz waves and a monitoring method thereof may be provided to simultaneously monitor a state of plasma formed inside a plasma chamber into which a wafer is inserted during a plasma process, and a status of the wafer having a film formed on a surface thereof through the plasma process.

Accordingly, the amount of plasma and the etching and deposition process performed on the wafer can be monitored in conjunction with each other, so that the etching and deposition quality of the film formed on the wafer can be improved.

In addition, according to the embodiment of the present invention, the uniformity of etching and deposition for a formed film and the uniformity of plasma used in etching and deposition processes may be confirmed for each pixel of a wafer of a substrate, so that, whether plasma is the cause when the unevenness of etching or deposition occurs on the wafer can be confirmed.

DESCRIPTION OF DRAWINGS

FIG. 1 is a conceptual diagram for explaining a plasma process monitoring apparatus using terahertz waves according to one embodiment of the present invention.

FIG. 2 is a view for explaining types of terahertz waves applied to the plasma process monitoring apparatus using terahertz waves according to the embodiment of the present invention.

FIG. 3 is a block diagram showing the plasma process monitoring apparatus using terahertz waves according to the embodiment of the present invention.

FIG. 4 is a schematic diagram for explaining a first monitoring module of the plasma process monitoring apparatus using terahertz waves according to the embodiment of the present invention.

FIGS. 5 and 6 are reference diagrams for explaining an optical system provided in the first monitoring module of the plasma process monitoring apparatus using terahertz waves according to the embodiment of the present invention.

FIG. 7 is a schematic diagram for explaining a transmission mode of a second monitoring module in the plasma process monitoring apparatus using terahertz waves according to the embodiment of the present invention.

FIG. 8 is a schematic diagram for explaining a reflection mode of the second monitoring module in the plasma process monitoring apparatus using terahertz waves according to the embodiment of the present invention.

FIG. 9 is a block diagram showing a plasma process monitoring apparatus using terahertz waves according to another embodiment of the present invention.

FIG. 10 is a schematic diagram for explaining a first monitoring module of the plasma process monitoring apparatus using terahertz waves according to another embodiment of the present invention.

FIG. 11 is a schematic diagram for explaining a transmission mode of a second monitoring module in the plasma process monitoring apparatus using terahertz waves according to another embodiment of the present invention.

FIG. 12 is a schematic diagram for explaining a reflection mode of the second monitoring module in the plasma process monitoring apparatus using terahertz waves according to another embodiment of the present invention.

FIGS. 13 to 15 are graphs showing results of monitoring the deposition thickness of SiN through the transmission mode of the present invention.

FIGS. 16 and 17 are graphs for predicting the SiN thickness through the reflection mode of the present invention.

FIGS. 18 to 20 are graphs separately showing a refractive index and an extinction coefficient of terahertz waves, and a relationship between the refractive index and the extinction coefficient according to a material deposited on the silicon wafer.

FIG. 21 is a graph showing waveforms collected through a transmission mode of a pulse type terahertz equipment.

FIGS. 22 to 24 are graphs showing terahertz waves, intensity changes, and phase changes for each plasma process condition using the transmission mode of the present invention.

FIG. 25 is a flowchart showing a plasma process monitoring method using terahertz waves according to one embodiment of the present invention.

BEST MODE

Mode for Invention

Hereinafter, exemplary embodiments of the present invention will be described in detail with reference to the accompanying drawings. However, the technical idea of the present invention is not limited to the exemplary embodiments described herein and may be embodied in other forms. Further, the embodiments are provided to enable contents disclosed herein to be thorough and complete and provided to enable those skilled in the art to fully understand the idea of the present invention.

In the specification, when one component is mentioned as being on another component, it signifies that the one component may be disposed directly on another component or a third component may be interposed therebetween. In addition, in the drawings, shapes and sizes may be exaggerated to effectively describe the technical content of the present invention.

In addition, although terms such as first, second and third are used herein to describe various components in various embodiments of the present specification, the components will not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

FIG. 1 is a conceptual diagram for explaining a plasma process monitoring apparatus using terahertz waves according to one embodiment of the present invention; FIG. 2 is a view for explaining types of terahertz waves applied to the plasma process monitoring apparatus using terahertz waves according to the embodiment of the present invention; FIG. 3 is a block diagram showing the plasma process monitoring apparatus using terahertz waves according to the embodiment of the present invention; FIG. 4 is a schematic diagram for explaining a first monitoring module of the plasma process monitoring apparatus using terahertz waves according to the embodiment of the present invention; FIGS. 5 and 6 are reference diagrams for explaining an optical system provided in the first monitoring module of the plasma process monitoring apparatus using terahertz waves according to the embodiment of the present invention; FIG. 7 is a schematic diagram for explaining a transmission mode of a second monitoring module in the plasma process monitoring apparatus using terahertz waves according to the embodiment of the present invention; and FIG. 8 is a schematic diagram for explaining a reflection mode of the second monitoring module in the plasma process monitoring apparatus using terahertz waves according to the embodiment of the present invention.

As shown in FIG. 1, a plasma process monitoring apparatus 100 (in FIG. 3) according to one embodiment of the present invention refers to an apparatus capable of using terahertz waves (THz waves) to simultaneously monitor plasma formed inside a plasma chamber 10 into which a wafer is inserted during a plasma process, and the wafer having a film formed on a surface thereof through the plasma process, for example, a plasma etching process and a plasma deposition process.

In order to monitor the plasma formed inside the plasma chamber 10 using terahertz waves, a first transmission window 11 and a second transmission window 12 may be provided on one side and an opposite side of the plasma chamber 10 in a circumferential direction to face each other.

In addition, a third transmission window 13 may be provided on an upper side of the plasma chamber 10 in order to monitor the wafer having the film formed on the surface thereof through the plasma process using terahertz waves. The monitoring of the wafer may be performed through one measuring mode of a transmission mode and a reflection mode, and this will be described below in more detail.

The first transmission window 11, the second transmission window 12, and the third transmission window 13 may be formed of a material for allowing terahertz waves to pass therethrough. For example, the first transmission window 11, the second transmission window 12, and the third transmission window 13 may be formed of one selected from the candidate material group including Si, HRFZ-SI, PTFE, PTFE, TPX and quartz (SiO2) which have high transmittance to the terahertz waves.

Meanwhile, as shown in FIG. 2, according to one embodiment of the present invention, the terahertz waves may be provided in a pulsed type. A femtosecond laser functioning as a pump light for generating pulse type terahertz waves may be irradiated to a first emitter 111 (in FIG. 4) described later, thereby generating pulse type terahertz waves from the first emitter 111.

The above pulse type terahertz waves are able to be detected at once because the pulse type terahertz waves contain numerous frequencies. On the other hand, since continuous wave type (CW type) terahertz waves in contrast thereto use only one frequency, changing the frequency may take time and accordingly it is disadvantageous for scanning. Therefore, according to the present invention, the plasma and the wafer are simultaneously monitored using pulse type terahertz waves.

Referring to FIG. 3, the plasma process monitoring apparatus 100 according to the embodiment of the present invention may be formed to include a first monitoring module 110 and a second monitoring module 120.

Referring further to FIG. 4, the first monitoring module 110 may be disposed outside the plasma chamber 10 into which the wafer is inserted. The first monitoring module 110 may be disposed outside the plasma chamber 10 in a direction parallel to a width direction of the wafer.

The first monitoring module 110 may use terahertz waves to monitor plasma formed inside the plasma chamber 10 during a plasma process for forming a film on the wafer.

According to one embodiment of the present invention, the first monitoring module 110 may include a first emitter 111, a first detector 112, and a first calculation unit 113.

The first emitter 111 may be disposed outside the plasma chamber 10 in the circumferential direction. The first emitter 111 may be disposed to face the first transmission window 11 provided on the one side of the plasma chamber 10 in the circumferential direction.

The first emitter 111 may generate pulse type terahertz waves in the direction of the first transmission window 11.

Like the first emitter 111, the first detector 112 may be disposed outside the plasma chamber 10 in the circumferential direction. The first detector 112 may be disposed to face the second transmission window 12 provided on the opposite side of the plasma chamber 10 in the circumferential direction.

The first detector 112 may detect pulse type terahertz waves generated from the first emitter 111 and passing through the plasma formed inside the plasma chamber 10.

In other words, the pulse type terahertz waves generated from the first emitter 111 may sequentially pass through the first transmission window 11, the plasma formed inside the plasma chamber 10, and the second transmission window 12, and then be detected by the first detector 112.

The calculation unit 113 may analyze a state of the plasma based on a signal detected by the first detector 112. For example, The calculation unit 113 may calculate changes in phase (time) and intensity (amplitude) of the terahertz waves subject to a plasma environment through a peak position of the pulse type terahertz waves detected by the first detector 112. Thus, according to one embodiment of the present invention, the state of the plasma may be monitored by calculating the changes in phase and intensity of the terahertz waves subject to the plasma environment through the first calculation unit 113.

Meanwhile, according to one embodiment of the present invention, the first monitoring module 110 may further include a first optical system 114 and a second optical system 115 in order to maximize sensitivity of the terahertz waves generated from the first emitter 111, sequentially passing through the first transmission window 11, the plasma formed inside the plasma chamber 10, and the second transmission window 12, and detected by the first detector 112.

The first optical system 114 and the second optical system 115 may be disposed outside the plasma chamber 10. In addition, the first optical system 114 and the second optical system 115 may be disposed on a propagation path of the pulse type terahertz waves generated from the first emitter 111 disposed on the one side in the circumferential direction of the plasma chamber 10.

According to one embodiment of the present invention, the first optical system 114 may be provided between the first emitter 111 and the first transmission window 11 formed on the one side of the plasma chamber 10 in the circumferential direction. In addition, the second optical system 115 may be provided between the first detector 112 and the second transmission window 12 formed on the opposite side of the plasma chamber 10 in the circumferential direction.

The first emitter 111 and the first optical system 114, and the second optical system 115 and the first detector 112 may be aligned in one direction with the plasma formed inside the plasma chamber 10 interposed therebetween.

The terahertz waves generated from the first emitter 111 may be irradiated to the plasma through the first optical system 114 and then guided to the first detector 112 by the second optical system 115.

According to one embodiment of the present invention, the first optical system 114 and the second optical system 115 may be provided in the form of a lens.

Referring to FIG. 5, the first optical system 114 and the second optical system 115 may be provided in the form of, for example, a convex lens. The first transmission window 11 and the second transmission window 12 may function as a flat lens.

In addition, referring to FIG. 6, the first optical system 114 and the second optical system 115 may be provided in the form of, for example, an F-THETA lens. Likewise, the first transmission window 11 and the second transmission window 12 may function as a plane lens.

However, in addition thereto, the first optical system 114 and the second optical system 115 may be formed of any one or a combination of an aspherical lens, a telecentric lens, a meniscus lens, and an axicon lens.

The first monitoring module 120 may be disposed outside the plasma chamber 10 to face the wafer. The second monitoring module 120 may be disposed in a thickness direction of the wafer.

The first monitoring module 120 may use terahertz waves to monitor the wafer having a film formed on a surface thereof through a plasma process.

According to one embodiment of the present invention, the first monitoring module 120 may monitor the wafer through one measuring mode of a transmission mode and a reflection mode.

Referring to FIG. 7, the second monitoring module 120 may include a second emitter 121, a second detector 122 and a second calculation unit 123 so as to monitor the wafer in the transmission mode.

The second emitter 121 may be disposed above the plasma chamber 10. The second emitter 121 may be disposed to face the third transmission window 13 provided at the top of the plasma chamber 10.

The second emitter 121 may generate pulse type terahertz waves in a direction of the third transmission window 13.

The second detector 122 may be disposed below the wafer. The second detector 122 may be disposed below the plasma chamber 10. The second detector 122 may be aligned with the second emitter 121 in the thickness direction of the wafer.

The second detector 122 may detect the pulse type terahertz waves generated from the second emitter 121 and then passing through the wafer.

In other words, the pulse type terahertz waves generated from the second emitter 121 may sequentially pass through the third transmission window 13, the plasma formed inside the plasma chamber 10, the wafer seated on a bottom of the plasma chamber 10 and the bottom of the chamber 10, and then be detected by the second detector 122.

The second calculation unit 123 may analyze a state of the wafer based on a signal detected by the second detector 122. The second calculation unit 123 may monitor a state of the wafer during the plasma process, for example, a deposition thickness of SiN formed as a film on the wafer, through changes in phase, intensity, refractive index, and extinction coefficient of the terahertz waves detected by the second detector 122.

The first monitoring module 120 may monitor a single pixel, as a target, among pixels partitioned on the wafer through the second emitter 121 and the second detector 122, and may simultaneously monitor multiple pixels. The simultaneous monitoring of multiple pixels may be performed by scanning the multiple pixels with the second emitter 121 and the second detector 122 which monitor a single pixel as a target.

According to one embodiment of the present invention, the first monitoring module 120 may further include a third optical system 124 and a fourth optical system 125 in order to maximize sensitivity of the terahertz waves generated from the second emitter 121, sequentially passing through the third transmission window 13, the plasma formed inside the plasma chamber 10, the wafer seated on the bottom of the plasma chamber 10 and the bottom of the plasma chamber 10, and then detected by the second detector 122.

The third optical system 124 and the fourth optical system 125 may be disposed outside the plasma chamber 10. In addition, the third optical system 124 and the fourth optical system 125 may be disposed on a propagation path of the pulse type terahertz waves generated from the second emitter 121 disposed above the plasma chamber 10.

According to one embodiment of the present invention, the third optical system 124 may be provided between the second emitter 121 and the third transmission window 13 formed on the upper side of the plasma chamber 10. In addition, the fourth optical system 125 may be provided between the wafer and the second detector 122, more specifically, between the bottom of the plasma chamber 10 and the second detector 122.

The second emitter 121 and the third optical system 124, and the fourth optical system 125 and the second detector 122 may be aligned in one direction, that is, in the thickness direction of the wafer with the wafer seated inside the plasma chamber 10 interposed therebetween.

The terahertz waves generated from the second emitter 121 may be irradiated to the wafer through the third optical system 124, pass through the wafer, and then be guided to the second detector 122 by the fourth optical system 125.

According to one embodiment of the present invention, the third optical system 124 and the fourth optical system 125 may be provided in the form of lenses, like the first optical system 114 and the second optical system 115.

The third optical system 124 and the fourth optical system 125 may be formed of any one or a combination of, for example, a convex lens, an F-THETA lens, a flat lens, an aspherical lens, a telecentric lens, a meniscus lens, and an axicon lens.

Meanwhile, referring to FIG. 8, the second monitoring module 120 may further include a third detector 126, a third calculation unit 127, and a fifth optical system 128. Through this, the second monitoring module 120 may switch the transmission mode into the reflection mode to monitor the wafer through the reflection mode.

The third detector 126 may be placed above the plasma chamber 10. The third detector 126 may be disposed at one side of the second emitter 121. The third detector 126 may be arranged to face a path different from the propagation path of the pulse type terahertz waves generated from the second emitter 121.

The third detector 126 may detect pulse type terahertz waves generated from the second emitter 121, irradiated to the wafer, and then reflected from the wafer.

The third calculation unit 127 may analyze a state of the wafer based on a signal detected by the third detector 126. For example, the third calculation unit 127 may predict a deposition thickness of SiN through a relationship between the refractive index of the terahertz waves and the thickness of the SiN film formed on the wafer, and a relationship between the extinction coefficient of the terahertz waves and the thickness of the SiN film.

The fifth optical system 128 may be provided between the third optical system 124 and the third detector 126. Accordingly, the pulse type terahertz waves generated from the second emitter 121 may be irradiated to the wafer through the third optical system 124, reflected from the wafer, focused by the third optical system 124, and irradiated toward the fifth optical system 128. The terahertz waves irradiated toward the fifth optical system 128 may be guided to the third detector 126 by the fifth optical system 128.

Hereinafter, a plasma process monitoring apparatus using terahertz waves according to another embodiment of the present invention will be described with reference to FIGS. 9 to 12.

FIG. 9 is a block diagram showing a plasma process monitoring apparatus using terahertz waves according to another embodiment of the present invention; FIG. 10 is a schematic diagram for explaining a first monitoring module of the plasma process monitoring apparatus using terahertz waves according to another embodiment of the present invention; FIG. 11 is a schematic diagram for explaining a transmission mode of a second monitoring module in the plasma process monitoring apparatus using terahertz waves according to another embodiment of the present invention; and FIG. 12 is a schematic diagram for explaining a reflection mode of the second monitoring module in the plasma process monitoring apparatus using terahertz waves according to another embodiment of the present invention.

Referring to FIG. 9, the plasma process monitoring apparatus 200 according to another embodiment of the present invention may be formed to include a first monitoring module 210 and a second monitoring module 220.

Compared to the one embodiment of the present invention, another embodiment of the present invention differs only in that the emitter and detector are moved instead of omitting the optical system. Thus, the remaining identical components will be assigned the same reference numerals, and detailed descriptions thereof will be omitted.

As shown in FIG. 10, according to another embodiment of the present invention, the first monitoring module 210 may include a first emitter 211, a first detector 212, and a first calculation unit 213.

The first emitter 211 may be disposed outside the plasma chamber 10 in the circumferential direction. The first emitter 211 may be disposed to face the first transmission window 11 provided on one side of the plasma chamber 10 in the circumferential direction. The first emitter 211 may generate pulse type terahertz waves in the direction of the first transmission window 11.

According to another embodiment of the present invention, the first emitter 211 may be provided to be movable in the width direction of the first transmission window 11. Accordingly, the first emitter 211 may generate terahertz waves while moving in the width direction of the first transmission window 11.

Like the first emitter 211, the first detector 212 may be disposed outside the plasma chamber 10 in the circumferential direction. The first detector 212 may be disposed to face the second transmission window 120 provided on the opposite side of the plasma chamber 10 in the circumferential direction. The first detector 212 may be aligned with the first emitter 211 in one direction with the plasma formed inside the plasma chamber 10 interposed therebetween.

According to another embodiment of the present invention, the first detector 212 may be linked to the movement of the first emitter 211. Accordingly, the first detector 212 may be movable in the width direction of the second transmission window 12. The first detector 212 may detect terahertz waves while moving in the width direction of the second transmission window 12 in conjunction with the movement of the first emitter 211.

The pulse type terahertz waves generated from the first emitter 111 may sequentially pass through the first transmission window 11, the plasma formed inside the plasma chamber 10, and the second transmission window 12, and then be detected by the first detector 112.

The first calculation unit 213 may analyze a state of plasma based on a signal detected by the first detector 212. Since the first calculation unit 213 according to another embodiment of the present invention has the same function and operation as the first calculation unit 113 (in FIG. 4) according to the one embodiment of the present invention, detailed description thereof will be omitted.

The second monitoring module 220 may be disposed outside the plasma chamber 10 in the thickness direction of the wafer. The second monitoring module 220 may use terahertz waves to monitor the wafer having a film formed on a surface thereof through a plasma process. According to another embodiment of the present invention, the second monitoring module 220 may monitor the wafer through one measuring mode of a transmission mode and a reflection mode.

Referring to FIG. 11, the second monitoring module 220 may include a second emitter 221, a second detector 222, and a second calculation unit 223. Through this, the second monitoring module 220 may monitor the wafer through the transmission mode. The second emitter 221 may be disposed above the plasma chamber 10. The second emitter 221 may be disposed to face the third transmission window 13 provided at the top of the plasma chamber 10.

According to another embodiment of the present invention, the second emitter 221 may be provided to be movable in the width direction of the third transmission window 13. Accordingly, the second emitter 221 may generate pulse type terahertz waves in the direction of the third transmission window 13 while moving in the width direction of the third transmission window 13.

The second detector 222 may be disposed below the wafer. The second detector 222 may be disposed below the plasma chamber 10. The second detector 222 may be aligned with the second emitter 221 in the thickness direction of the wafer.

According to another embodiment of the present invention, the second detector 222 may be linked to the movement of the second emitter 221. Accordingly, the second detector 222 may be movable in the width direction of the wafer. The second detector 222 may detect terahertz waves transmitting the wafer while moving in the width direction of the wafer in conjunction with the movement of the first emitter 221.

In other words, the pulse type terahertz waves generated from the second emitter 221 may sequentially pass through the third transmission window 13, the plasma formed inside the plasma chamber 10, the wafer seated on the bottom of the plasma chamber 10 and the bottom of the chamber 10, and then be detected by the second detector 222.

The second calculation unit 223 may analyze a state of the wafer based on a signal detected by the second detector 222. Since the second calculation unit 223 according to another embodiment of the present invention has the same function and operation as the second calculation unit 123 (in FIG. 7) according to the one embodiment of the present invention, detailed description thereof will be omitted.

Meanwhile, referring to FIG. 12, the second monitoring module 220 may further include a third detector 226, a third calculation unit 227, and a sixth optical system 229. Through this, the second monitoring module 220 may switch the transmission mode into the reflection mode to monitor the wafer through the reflection mode.

The third detector 226 may be disposed above the plasma chamber 10. The third detector 226 may be disposed at one side of the second emitter 221. The third detector 226 may be arranged to face a path different from the propagation path of the pulse type terahertz waves generated from the second emitter 221.

The third detector 226 may detect pulse type terahertz waves generated from the second emitter 221, irradiated to the wafer, and then reflected from the wafer.

The third calculation unit 227 may analyze a state of the wafer based on a signal detected by the third detector 226. Since the third calculation unit 227 according to another embodiment of the present invention has the same function and operation as the third calculation unit 127 (in FIG. 8) according to the one embodiment of the present invention, detailed descriptions thereof will be omitted.

The sixth optical system 229 may be provided between the wafer and the third detector 226. According to another embodiment of the present invention, the sixth optical system 229 may be linked to the movement of the second emitter 221. Accordingly, the sixth optical system 229 may be movable in the width direction of the wafer.

According to another embodiment of the present invention, the second emitter 221 may generate pulse type terahertz waves while moving in the width direction of the third transmission window 13, and the sixth optical system 229 may guide the pulse type terahertz waves reflected from the wafer to the third detector 226 in conjunction with the movement of the second emitter 221.

Meanwhile, FIGS. 13 to 15 show the results of monitoring wafers having different SiN deposition thicknesses through the transmission mode of the present invention. FIG. 13 is a graph showing waveforms of pulse type terahertz waves for each wafer; FIG. 14 is a graph showing changes in refractive index of the pulse type terahertz waves for each wafer; and FIG. 15 is a graph showing changes in extinction coefficient of the pulse type terahertz waves for each wafer.

As shown in the above graphs, it can be confirmed that the refractive index of the terahertz waves tends to decrease and the extinction coefficient of the terahertz waves tends to increase as the thickness of SiN deposited on the wafer increases. In other words, it can be analyzed that the deposition thickness of SiN increases when the refractive index of the terahertz waves is monitored as decreasing and the extinction coefficient is monitored as increasing.

FIGS. 16 and 17 are graphs for predicting the SiN thickness through the reflection mode of the present invention. FIG. 16 is a graph obtained by curve fitting the relationship between the refractive index of terahertz waves and the thickness of SiN; and FIG. 17 is a graph obtained by curve fitting the relationship between the extinction coefficient of terahertz waves and the thickness of SiN.

As shown in the above graphs, the thickness of SiN deposited on a silicon wafer may be predicted by calculating estimation data based on actual measured data.

FIGS. 18 to 20 are graphs separately showing a refractive index and an extinction coefficient of terahertz waves, and a relationship between the refractive index and the extinction coefficient according to materials (nitride, photo resist, thermal oxide) deposited on the silicon wafer.

As shown in the above graphs, since terahertz waves have different optical properties depending on the type of material deposited on the silicon wafer, the refractive index and extinction coefficient range are different for each material. Accordingly, it is confirmed that the type of material deposited on the silicon wafer can be predicted through terahertz waves.

Meanwhile, FIG. 21 is a graph showing waveforms of terahertz waves collected through a transmission mode of a pulse type terahertz equipment. Changes in phase (time) and intensity (amplitude) subject to the plasma environment may be calculated through peak positions of the waveforms collected through the pulse type terahertz equipment. Accordingly, the state of plasma may be monitored using terahertz waves.

In addition, FIGS. 22 to 24 are graphs showing terahertz waves, intensity changes, and phase changes for each plasma process condition using the transmission mode of the present invention.

As shown in the above graphs, it can be seen that the plasma has the higher intensity as the output and mass flow rate of an RF generator for generating plasma are higher, thereby gradually decreasing the intensity and phase of terahertz waves passing therethrough. Plasma process conditions may be distinguished by analyzing the changes in intensity and phase of terahertz waves.

Hereinafter, a plasma process monitoring method using terahertz waves according to one embodiment of the present invention will be described with reference to FIG. 25. The reference numerals of each component refer to FIGS. 1 to 8.

FIG. 25 is a flowchart showing a plasma process monitoring method using terahertz waves according to one embodiment of the present invention.

Referring to FIG. 25, the plasma process monitoring method using terahertz waves according to the one embodiment of the present invention may include step S110 and step S120. The plasma process monitoring method using terahertz waves according to the one embodiment of the present invention may be performed through the plasma process monitoring apparatus 100 using the terahertz waves according to the one embodiment of the present invention.

Step S110

Step S110 refers to a step of using the terahertz waves to monitor plasma formed inside the plasma chamber 10 during the plasma process for forming a film on a wafer inserted into the plasma chamber 10.

In step S110, first, pulse type terahertz waves may be generated in an inner direction of the plasma chamber 10 through the first emitter 111.

Thereafter, in step S110, the pulse type terahertz waves passing through plasma formed inside the plasma chamber 10 during the plasma process such as an etching or deposition process may be detected through the first detector 112.

Thereafter, in step S110, a state of the plasma may be analyzed, through the first calculation unit 113, based on the signal detected by the first detector 112.

In step S110, in order to maximize sensitivity of the pulse type terahertz waves generated from the first emitter 111, passing through the plasma, and then detected by the first detector 112, the first optical system 114 may be disposed between the first emitter 111 and the first transmission window 11, and the second optical system 115 may be disposed between the second transmission window 12 and the first detector 112.

The first optical system 114 and the second optical system 115 may be provided in the form of lenses, and for example, may be provided as any one or a combination of a convex lens, a flat lens, an F-THETA lens, an aspherical lens, a telecentric lens, a meniscus lens, and an axicon lens.

Step S120

Step S120 refers to a step of using pulse type terahertz waves to monitor the wafer having the film formed on the surface thereof through the plasma process. According to one embodiment of the present invention, step S110 of monitoring the plasma and the step S120 of monitoring the wafer may be performed simultaneously.

In step S120, a state of the wafer may be analyzed based on the signal detected from the pulse type terahertz waves passing through the wafer.

To this end, in step S120, first, pulse type terahertz waves may be generated toward the wafer through the second emitter 121 provided above the wafer.

Thereafter, in step S120, the pulse type terahertz waves generated from the second emitter 121 and passing through the wafer may be detected through the second detector 122. Thereafter, in step S120, the state of the wafer may be analyzed, through the second calculation unit 123, based on the signal detected by the second detector 122.

In step S120, in order to maximize sensitivity of the pulse type terahertz waves generated from the second emitter 121, passing through the wafer, and then detected by the second detector 122, the third optical system 124 may be disposed between the second emitter 121 and the wafer, and the fourth optical system 124 may be disposed between the wafer and the second detector 122.

The third optical system 124 and the fourth optical system 124 may be disposed outside the plasma chamber 10.

Meanwhile, in step S120, the state of the wafer may be analyzed based on the signal detected by the pulse type terahertz waves reflected from the wafer.

To this end, in step S120, the pulse type terahertz waves may be generated toward the wafer through the second emitter 121 provided above the wafer.

Thereafter, in step S120, the pulse type terahertz waves generated from the second emitter 121, irradiated to the wafer, and then reflected from the wafer may be detected through the third detector 126 provided at one side of the second emitter 121.

Thereafter, in step S120, the state of the wafer may be analyzed, through the third calculation unit 127, based on the signal detected by the third detector 126.

In step S120, the fifth optical system 128 may be disposed between the third optical system 124 and the third detector 126 in order to guide the pulse type terahertz waves reflected from the wafer and focused by the third optical system 124 to the third detector 126.

Although the present invention has been described in detail with reference to the preferred embodiments, the present invention is not limited to the specific embodiments and shall be interpreted by the following claims. In addition, it will be apparent that a person having ordinary skill in the art may carry out various deformations and modifications for the embodiments described as above within the scope without departing from the present invention.

The invention claimed is:

1. A plasma process monitoring apparatus using terahertz waves, the plasma process monitoring apparatus comprising:
   a first monitoring module disposed in a direction parallel to the width direction of a wafer on the outside of a plasma chamber in which the wafer is introduced and monitoring plasma formed inside the plasma chamber during a plasma process for forming a film on the wafer by using terahertz waves; and
   a second monitoring module disposed outside the plasma chamber in the thickness direction of the wafer so as to face the wafer and monitoring the wafer on which a film is formed on a surface through the plasma process by using the terahertz waves.

2. The plasma process monitoring apparatus of claim 1, wherein the terahertz waves are provided in a pulsed type.

3. The plasma process monitoring apparatus of claim 1, wherein the plasma chamber is provided on one side and an opposite side thereof with a first transmission window and a second transmission window in a circumferential direction to face each other, and
   the first monitoring module includes:
   a first emitter facing the first transmission window to generate terahertz waves in a direction of the first transmission window;
   a first detector facing the second transmission window and aligned in one direction with the first emitter to detect the terahertz waves generated from the first emitter and passing through plasma formed inside the plasma chamber; and
   a first calculation unit for analyzing a state of the plasma based on a signal detected by the first detector.

4. The plasma process monitoring apparatus of claim 3, wherein the first monitoring module further includes a first optical system and a second optical system, in which the first optical system is provided between the first emitter and the first transmission window, the second optical system is provided between the second transmission window and the first detector, and the terahertz waves generated from the first emitter are irradiated to the plasma through the first optical system and then guided to the first detector by the second optical system.

5. The plasma process monitoring apparatus of claim 3, wherein the first emitter generates the terahertz waves while moving in a width direction of the first transmission window, and the first detector detects the terahertz waves while moving in a width direction of the second transmission window in conjunction with movement of the first emitter.

6. The plasma process monitoring apparatus of claim 1, wherein the plasma chamber is provided on an upper side thereof with a third transmission window, and
   the second monitoring module monitors the wafer in a transmission mode, and includes:
   a second emitter facing the third transmission window to generate terahertz waves in a direction of the third transmission window;
   a second detector disposed below the wafer and aligned with the second emitter in a thickness direction of the wafer to detect the terahertz waves generated from the second emitter and passing through the wafer; and
   a second calculation unit for analyzing a state of the wafer based on a signal detected by the second detector.

7. The plasma process monitoring apparatus of claim 6, wherein the second monitoring module further includes a third optical system and a fourth optical system, in which the third optical system is provided between the second emitter and the third transmission window, the fourth optical system is provided between the wafer and the second detector, and the terahertz waves generated from the second emitter are irradiated to the wafer through the third optical system, pass through the wafer, and then are guided to the second detector by the fourth optical system.

8. The plasma process monitoring apparatus of claim 7, wherein the second monitoring module switches the transmission mode into a reflection mode to further monitor the wafer, and further includes:
   a third detector disposed at one side of the second emitter to detect the terahertz waves generated from the second emitter, irradiated to the wafer, and then reflected from the wafer; and
   a third calculation unit for analyzing a state of the wafer based on a signal detected by the third detector.

9. The plasma process monitoring apparatus of claim 8, wherein the second monitoring module further includes a fifth optical system, in which the fifth optical system is provided between the third optical system and the third detector, and the terahertz waves generated from the second emitter are irradiated to the wafer through the third optical system, reflected from the wafer, focused by the third optical system, irradiated toward the fifth optical system, and then guided to the third detector by the fifth optical system.

10. The plasma process monitoring apparatus of claim 6, wherein the second emitter generates the terahertz waves while moving in a width direction of the third transmission window, and the second detector detects the terahertz waves passing through the wafer while moving in a width direction of the wafer in conjunction with movement of the second emitter.

11. The plasma process monitoring apparatus of claim 10, wherein the second monitoring module switches the transmission mode into a reflection mode to monitor the wafer, and further includes:
   a third detector disposed at one side of the second emitter to detect the terahertz waves generated from the second emitter, irradiated to the wafer, and then reflected from the wafer;
   a third calculation unit for analyzing a state of the wafer based on a signal detected by the third detector; and a sixth optical system provided between the wafer and the third detector, wherein the second emitter generates the terahertz waves while moving in a width direction of the third transmission window, and the sixth optical system guides the terahertz waves reflected from the wafer to the third detector in conjunction with the movement of the second emitter.

12. The plasma process monitoring apparatus of claim 1, wherein the plasma chamber is provided on one side and an opposite side thereof with a first transmission window and a second transmission window in a circumferential direction to face each other and provided on an upper side thereof with a third transmission window, in which the first transmission window to third transmission window are formed of any one selected from a candidate material group including Si, HRFZ-SI, PTFE, PTFE, TPX, and quartz (SiO2) to transmit the terahertz waves.

13. A plasma process monitoring method using terahertz waves, the plasma process monitoring method comprising:

using the terahertz waves to monitor plasma formed inside a plasma chamber during a plasma process for forming a film on a wafer inserted inside the plasma chamber; and using the terahertz waves to monitor the wafer having the film formed on a surface thereof through the plasma process, wherein the monitoring of the plasma and the monitoring of the wafer are performed simultaneously, and the terahertz waves are provided in a pulsed type.

14. The plasma process monitoring method of claim 13, wherein the monitoring of the plasma includes analyzing a state of the plasma based on a signal detected by terahertz waves passing through the plasma formed inside the plasma chamber, and the monitoring of the wafer includes analyzing a state of the wafer based on a signal obtained by detecting terahertz waves passing through the wafer or analyzing a state of the wafer based on a signal obtained by detecting terahertz waves reflected from the wafer.

* * * * *

UNITED STATES PATENT AND TRADEMARK OFFICE
CERTIFICATE OF CORRECTION

PATENT NO. : 12,198,893 B2  
APPLICATION NO. : 18/647096  
DATED : January 14, 2025  
INVENTOR(S) : Hak Sung Kim et al.

Page 1 of 1

It is certified that error appears in the above-identified patent and that said Letters Patent is hereby corrected as shown below:

On the Title Page

Item (72), should read as follows:
(72) Inventors: Hak Sung Kim, Seoul (KR); Dong Woon Park, Seoul (KR); Heon Su Kim, Seoul (KR); Sang Il Kim, Seoul (KR)

Signed and Sealed this  
Fourth Day of March, 2025

Coke Morgan Stewart  
*Acting Director of the United States Patent and Trademark Office*